(12) United States Patent
Yu

(10) Patent No.: US 6,274,910 B1
(45) Date of Patent: Aug. 14, 2001

(54) ESD PROTECTION CIRCUIT FOR SOI TECHNOLOGY

(75) Inventor: Ta-Lee Yu, Hsinchu Hsien (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/457,922

(22) Filed: Dec. 9, 1999

(30) Foreign Application Priority Data

Sep. 6, 1999 (TW) .................................................. 88115316

(51) Int. Cl.⁷ ...................................................... H01L 29/72
(52) U.S. Cl. .......................... 257/355; 257/107; 257/111; 257/119
(58) Field of Search ................................ 257/107, 111, 257/119, 355

(56) References Cited

U.S. PATENT DOCUMENTS 5,453,384 * 9/1995 Chatterjee ............................. 257/107
5,600,160 * 2/1997 Hvistendahl ........................ 257/107

* cited by examiner

Primary Examiner—Edward Wojciechowicz
(74) Attorney, Agent, or Firm—Fish & Richardson P.C.

(57) ABSTRACT

An ESD protection circuit is fabricated on a semiconductor block on an insulating layer overlying a supporting substrate. The ESD protection circuit comprises a first N-type doped region, a first P-type doped region, a second N-type doped region and a second P-type doped region sequentially formed in the semiconductor block, and a stacked structure overlying the first P-type doped region and the second N-type doped region, wherein the first N-type doped region is more heavily doped than the second N-type doped region and the first P-type doped region is more lightly doped than the second P-type doped region.

19 Claims, 1 Drawing Sheet

US 6,274,910 B1

ESD PROTECTION CIRCUIT FOR SOI TECHNOLOGY

BACKGROUND OF THE INVENTION

1. Field of the Invention

The present invention generally relates to electrostatic discharge protection techniques. More particularly, the present invention relates to an electrostatic discharge protection circuit fabricated in semiconductor-on-insulator structures.

2. Description of the Related Art

Semiconductor-on-insulator (SOI) technology employs a semiconductor film overlying an insulating layer on a supporting substrate. Therefore, field effect transistors such as MOSFETs fabricated in the semiconductor film of an SOI structure have many advantages over those MOSFETs fabricated on the traditional bulk semiconductor substrates, including resistance to short-channel effect, steeper sub-threshold slopes, increased current drive, higher packing density, reduced parasitic capacitance, and simpler processing steps.

However, a major obstacle to the use of SOI technology in production is electrostatic discharge (ESD) susceptibility. In bulk-substrate technology, good ESD protection levels have been demonstrated by using nMOS/CMOS buffers. However, this protection scheme is not compatible with SOI structures. For instance, thick-oxide devices are not available on an SOI substrate. Furthermore, vertical large-area low-series-resistance PN junctions are not available if the semiconductor film is thinner than 2000 Å.

SUMMARY OF THE INVENTION

It is therefore an object of the present invention to provide an ESD protection circuit fabricated in SOI structures to functionally bypass ESD stress.

For attaining the aforementioned object, the present invention provides an ESD protection circuit fabricated on a semiconductor block on an insulating layer overlying a supporting substrate. The ESD protection circuit comprises a first N-type doped region, a first P-type doped region, a second N-type doped region and a second P-type doped region sequentially formed in the semiconductor block, and a stacked structure overlying the first P-type doped region and the second N-type doped region, wherein the first N-type doped region is more heavily doped than the second N-type doped region and the first P-type doped region is more lightly doped than the second P-type doped region.

Accordingly, the first N-type doped region, the first P-type doped region, the second N-type doped region, and the second P-type doped region constitute a semiconductor controlled rectifier as a cathode, a cathode gate, an anode gate and an anode, respectively. When ESD stresses between the first N-type doped region and the second P-type doped region, the PN junction between the first P-type doped region and the second N-type doped region enters breakdown so that the semiconductor controlled rectifier is triggered to conduct a discharge current and thus bypass the ESD stress for protecting other circuits or devices from ESD damage.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1:
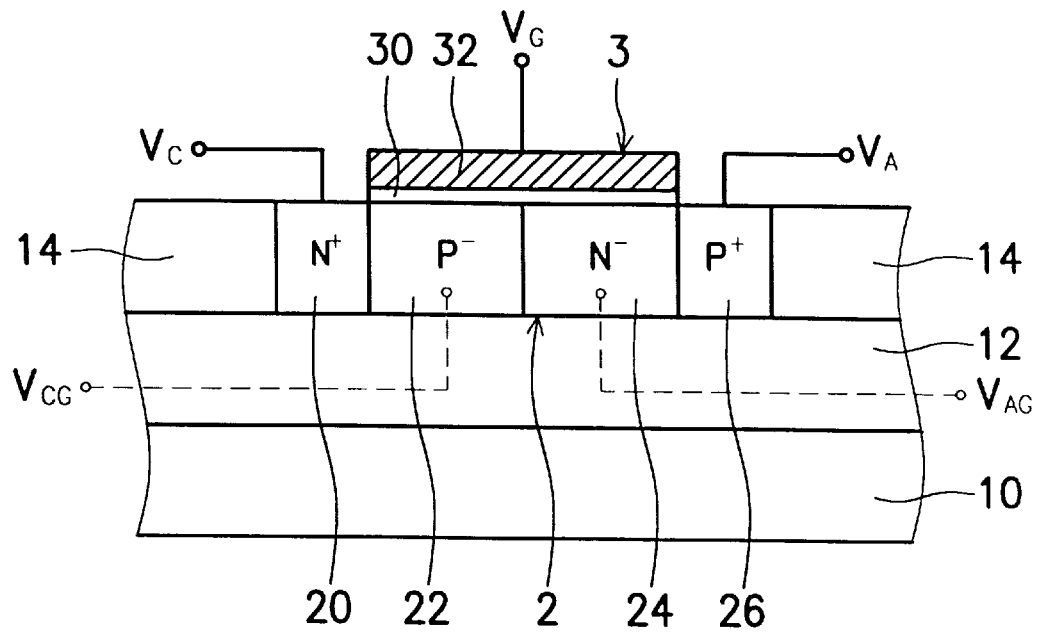
FIG. 1 illustrates an ESD protection circuit in accordance with one preferred embodiment of the present invention.

Referring to FIG. 1, an ESD protection circuit in accordance with one preferred embodiment of the present invention is schematically illustrated. According to the present invention, the ESD protection circuit is fabricated on a semiconductor block 2 which is formed on an insulating layer 12 overlying a supporting substrate 10. Therefore, the semiconductor block 2 is electrically isolated from the supporting substrate 10 by the insulating layer 12. The supporting substrate 10 can be a silicon wafer of N-type or P-type; thus, the insulating layer 12 can be a layer of silicon oxide. The SOI structure can be formed by a number of well-known techniques, such as epitaxial lateral overgrowth (ELO), lateral solid-phase epitaxy (LSPE), zone melting and recrystallization (ZMR), separation by implanted oxygen (SIMOX), or wafer-bonding and etchback (SIBOND).

Figure 2:
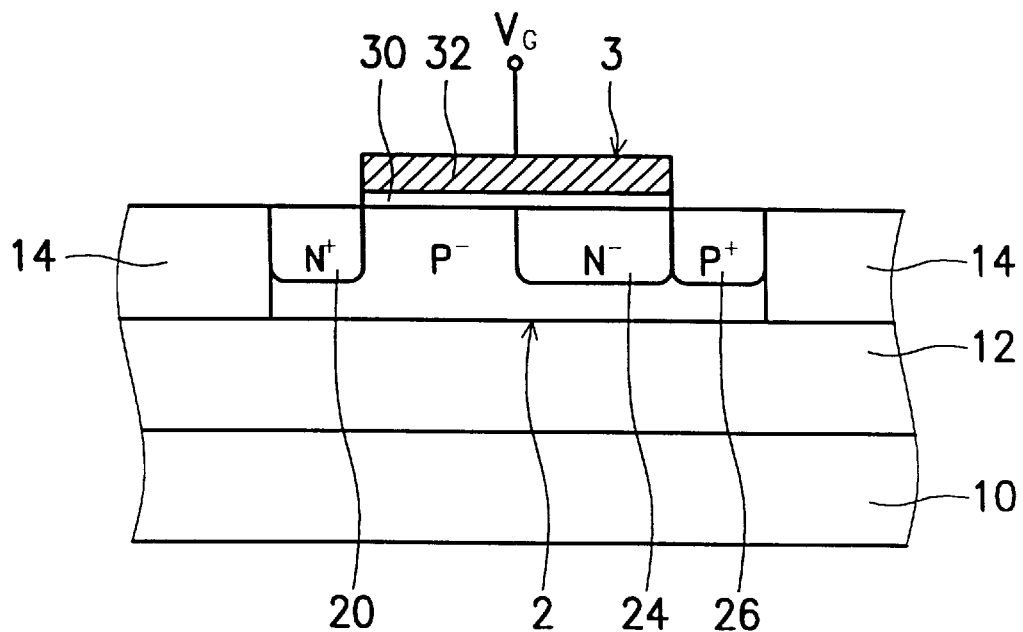
FIG. 2 illustrates an ESD protection circuit in accordance with another preferred embodiment of the present invention.

In general, each semiconductor block is provided for the fabrication of one device. Therefore, a plurality of semiconductor blocks are provided for integrated circuitry. In FIG. 2, reference numerals 14 designates isolating structures formed between different adjacent semiconductor blocks. The isolating structures 14 can be shallow trench isolation (STI) structures.

According to the present invention, the ESD protection circuit comprises a first N-type doped region 20, a first P-type doped region 22, a second N-type doped region 24, and a second P-type doped region 26 in a lateral sequence. That is, the first P-type doped region 22 is arranged between the first N-type doped region 20 and the second N-type doped region 24, and the second N-type doped region 24 is arranged between the first P-type doped region 22 and the second P-type doped region 26. In addition, the first N-type doped region 20 has a doping concentration heavier than that of the second N-type doped region 24, while the first P-type doped region 22 has a doping concentration lighter than that of the second P-type doped region 26. In other words, the first N-type doped region 20 and the second P-type doped region 26 are heavily-doped regions with a doping concentration of about $1 \times 10^{19} \sim 1 \times 10^{21}$ atoms/cm$^3$, while the second N-type doped region 24 and the first P-type doped region 22 are lightly-doped regions with a doping concentration of about $1 \times 10^{15} \sim 1 \times 10^{18}$ atoms/cm$^3$.

Accordingly, the first N-type doped region 20, the first P-type doped region 22, the second N-type doped region 24, and the second P-type doped region 26 constitute a semiconductor controlled rectifier as a cathode, a cathode gate, an anode gate and an anode, respectively. If ESD occurs at the first N-type doped region 20 or the second P-type doped region 26, the junction between the first N-type doped region 20 and the first P-type doped region 22 or between the second N-type doped region 24 and the second P-type doped region 26 is forward biased. When the PN junction between the first P-type doped region 22 and the second N-type doped region 24 enters breakdown, the semiconductor controlled rectifier is triggered to conduct a discharge current and thus bypass the ESD stress so as to protect other circuits or devices from ESD damage.

If the ESD protection circuit of FIG. 1 is provided between an IC pad and $V_{SS}$ power rail, the semiconductor controlled rectifier is configured with the second P-type doped region 26 connected to the IC pad and the first N-type doped region 20 connected to the $V_{SS}$ power rail. If the ESD protection circuit of FIG. 1 is provided between an IC pad and $V_{DD}$ power rail, the semiconductor controlled rectifier is configured with the second P-type doped region 26 connected to the $V_{DD}$ power rail and the first N-type doped region 20 connected to the IC pad. If the ESD protection circuit of FIG. 1 is provided between $V_{DD}$ and $V_{SS}$ power rails, the semiconductor controlled rectifier is configured with the second P-type doped region 26 connected to the $V_{DD}$ power rail and the first N-type doped region 20 connected to the $V_{SS}$ power rail.

In addition, a stacked structure 3 is provided to overlie the first P-type doped region 22 and the second N-type doped region 24. The stacked structure 3 includes a dielectric layer 30 overlying the first P-type doped region 22 and the second N-type doped region 24 and a conductive layer 32 formed on the dielectric layer 30.

Assume that $V_G$, $V_C$, $V_{CG}$, $V_{AG}$ and $V_A$ denote voltage nodes of the conductive layer 32, the first N-type doped region 20, the first P-type doped region 22, the second N-type doped region 24 and the second P-type doped region 26, respectively. The connection combination of the conductive layer 32, the first P-type doped region 22 and the second N-type doped region 24 is listed in the following table.

| $V_G$ | $V_{AG}$ | $V_{CG}$ |
|---|---|---|
| Floating | Floating | Floating |
| $V_C$ or $V_{SS}$ | Floating | Floating |
| $V_A$ or $V_{DD}$ | Floating | Floating |
| $V_C$ or $V_{SS}$ | $V_C$ or V | Floating |
| $V_A$ or $V_D$ | Floating | $V_A$ or $V_{DD}$ |
| Positive voltage X1 | Floating | Positive voltage X2 |
| Negative voltage Y1 | Negative voltage Y2 | Floating |

Where X1 should be greater than X2.

Referring to FIG. 2, an ESD protection circuit in accordance with another preferred embodiment of the present invention is schematically illustrated. In the drawing, the junction depths of the first N-type doped region 20 and the second P-type doped region 26 are smaller than the thickness of the semiconductor block 2. Moreover, if the semiconductor block 2 is made of as-deposited silicon material of lightly P-type, the first N-type doped region 20, the second N-type doped region 24 and the second P-type doped region 26 are desired to be formed in the semiconductor block 2.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An ESD protection circuit fabricated on a semiconductor block on an insulating layer overlying a supporting substrate, said ESD protection circuit comprising:
    a first N-type doped region, a first P-type doped region, a second N-type doped region and a second P-type doped region sequentially formed in said semiconductor block, where said first N-type doped region is more heavily doped than said second N-type doped region and first P-type doped region is more lightly doped than said second p-type doped region; and
    a stacked structure including a dielectric layer and a conductive layer sequentially overlying said first P-type doped region and said second N-type doped region;
    wherein said first N-type doped region and said second P-type doped region are respectively coupled to a relatively low voltage and a relatively high voltage during operation.

2. The ESD protection circuit as claimed in claim 1, wherein said stacked structure comprises a dielectric layer and a conductive layer.

3. The ESD protection circuit as claimed in claim 2, wherein said conductive layer is electrically floating.

4. The ESD protection circuit as claimed in claim 3, wherein said first P-type doped region and said second N-type doped region are electrically floating.

5. The ESD protection circuit as claimed in claim 2, wherein said conductive layer is electrically coupled to said first N-type doped region.

6. The ESD protection circuit as claimed in claim 5, wherein said first P-type doped region and said second N-type doped region are electrically floating.

7. The ESD protection circuit as claimed in claim 2, wherein said conductive layer is electrically coupled to said second P-type doped region.

8. The ESD protection circuit as claimed in claim 7, wherein said first P-type doped region and said second N-type doped region are electrically floating.

9. The ESD protection circuit as claimed in claim 2, wherein both said conductive layer and said second N-type doped region are electrically coupled to said first N-type doped region.

10. The ESD protection circuit as claimed in claim 9, wherein said first P-type doped region is electrically floating.

11. The ESD protection circuit as claimed in claim 2, wherein both said conductive layer and said first P-type doped region are electrically coupled to said second P-type doped region.

12. The ESD protection circuit as claimed in claim 11, wherein said second N-type doped region is electrically floating.

13. The ESD protection circuit as claimed in claim 2, wherein said conductive layer and said second N-type doped region are biased by a first negative voltage and a second negative voltage under circuit operation, respectively.

14. The ESD protection circuit as claimed in claim 13, wherein said first P-type doped region is electrically floating.

15. The ESD protection circuit as claimed in claim 2, wherein said conductive layer and said first P-type doped region are biased by a first positive voltage and a second positive voltage during circuit operation, respectively.

16. The ESD protection circuit as claimed in claim 15, wherein said second N-type doped region is electrically floating.

17. An ESD protection circuit fabricate on a semiconductor layer of an SOI structure, comprising:
    a semiconductor-controlled rectifier comprising a first N-type doped layer, a first P-type doped layer, a second N-type doped layer and a second P-type doped layer sequentially formed in said semiconductor layer, said first P-type doped layer acting as a cathode gate and said second N-type doped layer acting as an anode gate; and
    a gate structure including a dielectric layer and a conductive layer sequentially overlying said cathode gate and said anode gate of said semiconductor-controlled rectifier;

wherein said first N-type doped region and said second P-type doped region are respectively coupled to a relatively low voltage and a relatively high voltage during operation.

18. The ESD protection circuit as claimed in claim 17, wherein said semiconductor-controlled rectifier has a cathode and an anode with junction depths substantially equal to the thickness of said semiconductor layer.

19. The ESD protection circuit as claimed in claim 17, wherein said semiconductor-controlled rectifier has a cathode and an anode with junction depths smaller than the thickness of said semiconductor layer.

* * * * *